(12) United States Patent
Sano et al.

(10) Patent No.: US 6,960,718 B2
(45) Date of Patent: Nov. 1, 2005

(54) METHOD FOR MANUFACTURING A PHOTOVOLTAIC ELEMENT

(75) Inventors: Tatsuji Sano, Narita (JP); Hisao Morooka, Nakakoma-gun (JP); Kazuo Nishi, Nakakoma-gun (JP)

(73) Assignees: TDK Corporation, Tokyo (JP); Semiconductor Energy Laboratory Co., Ltd., Atsugi (JP)

( * ) Notice: Subject to any disclaimer, the term of this patent is extended or adjusted under 35 U.S.C. 154(b) by 235 days.

(21) Appl. No.: 10/400,447

(22) Filed: Mar. 28, 2003

(65) Prior Publication Data

US 2003/0205269 A1 Nov. 6, 2003

Related U.S. Application Data

(62) Division of application No. 09/824,214, filed on Apr. 3, 2001, now Pat. No. 6,566,594.

(30) Foreign Application Priority Data

Apr. 5, 2000 (JP) .................................... 2000-103535
Apr. 5, 2000 (JP) .................................... 2000-103540

(51) Int. Cl.⁷ ...................... H01L 31/075; H01L 31/18
(52) U.S. Cl. ........................ 136/255; 438/96; 438/97; 438/98; 438/74; 438/57; 438/85; 438/513; 136/252; 136/258; 136/261; 136/249; 257/458
(58) Field of Search .............................. 438/96, 97, 98, 438/74, 57, 85, 513; 136/255, 252, 258, 261, 249; 257/458

(56) References Cited

U.S. PATENT DOCUMENTS

| | | | |
|---|---|---|---|
| 4,329,699 A | * | 5/1982 | Ishihara et al. ............... 257/55 |
| 4,519,339 A | | 5/1985 | Izu et al. |
| 4,851,256 A | * | 7/1989 | Matsuyama et al. ......... 427/578 |
| 5,032,884 A | * | 7/1991 | Yamagishi et al. ......... 257/458 |
| 5,244,509 A | | 9/1993 | Arao et al. |
| 5,573,601 A | | 11/1996 | Saitoh et al. |
| 6,168,968 B1 | | 1/2001 | Umemoto et al. |
| 6,242,686 B1 | | 6/2001 | Kishimoto et al. |
| 6,566,594 B2 | * | 5/2003 | Sano et al. .................. 136/255 |
| 2002/0002992 A1 | * | 1/2002 | Kariya et al. ............... 136/255 |
| 2003/0155074 A1 | * | 8/2003 | Yao ........................ 156/345.26 |
| 2005/0087225 A1 | * | 4/2005 | Morooka et al. ........... 136/256 |

FOREIGN PATENT DOCUMENTS

| | | |
|---|---|---|
| JP | 61-251020 A | 11/1986 |
| JP | 62-177981 A | 8/1987 |
| JP | 62-188381 A | 8/1987 |
| JP | 2-197117 A | 8/1990 |
| JP | 3-106079 A | 5/1991 |
| JP | 3-280475 A | 12/1991 |
| JP | 4-326577 A | 11/1992 |
| JP | 11-135814 A | 5/1999 |

OTHER PUBLICATIONS

Asano, "Effects of hydrogen atoms on the network structure of hydrogenated amorphous and microcrystalline silicon thin films", Appl. Phys. Lett, 56, Feb. 5, 1990.

* cited by examiner

*Primary Examiner*—Alan Diamond
(74) *Attorney, Agent, or Firm*—Oliff & Berridge, PLC

(57) ABSTRACT

In a photovoltaic element according to the present invention, a first transparent conductive film, a second transparent conductive film, a p-type semiconductor film, an intrinsic semiconductor layer, a n-type semiconductor layer and a backside electrode are stacked in turn on a transparent substrate. Then, an intermediate layer is provided between the second transparent conductive film and the p-type semiconductor layer so as to cover the first transparent conductive film and the second transparent conductive film.

14 Claims, 5 Drawing Sheets

PRIOR ART

METHOD FOR MANUFACTURING A PHOTOVOLTAIC ELEMENT

This is a Division of application Ser. No. 09/824,214 filed Apr. 3, 2001 now U.S. Pat. No. 6,566,594. The entire disclosure of the application is hereby incorporated by reference herein in its entirety.

BACKGROUND OF THE INVENTION

1. Field of the Invention

This invention relates to a photovoltaic element and a method for manufacturing the same, particularly to a photovoltaic element and a manufacturing method of the photovoltaic element which are suitable for semiconductor elements to constitute a solar battery.

2. Related Art Statement

Attention has been paid to a thin film solar battery formed by a vapor phase epitaxy method, and various research and development are carried out for the thin film solar battery. Generally, the thin film solar battery is composed of a photovoltaic element in which a transparent conductive film, a first conduction-type semiconductor layer, an intrinsic semiconductor layer and a second conduction-type semiconductor layer are stacked on a transparent substrate in turn.

FIG. 1 is a structural view showing a conventional photovoltaic element.

In a photovoltaic element 10 depicted in FIG. 1, a transparent conductive film 2, a p-type semiconductor layer 3, an intrinsic semiconductor layer 4, a n-type semiconductor layer 5 and a backside electrode 6 are stacked on a transparent substrate 1.

The transparent substrate 1 is composed of a glass substrate or a resin film made of polyethylene naphthalate (PEN), polyethersulfone (PES), polyethylene terephthalate (PET) or the like.

The transparent conductive film 2 is formed, of tin oxide, ITO, ZnO or the like, in a thickness of about 1 $\mu$m or below by sputtering or firing.

The p-type semiconductor layer 3, the intrinsic semiconductor layer 4 and the n-type semiconductor layer 5 are formed in a thickness of about 1 $\mu$m or below by plasma CVD, etc. These semiconductor layers include a Si semiconductor material as a base matrix. The p-type semiconductor layer also includes a dopant such as B, and the n-type semiconductor layer also includes a dopant such as P.

The backside electrode 6 is formed, of a metallic material such as Al, Ag, or Ti, in a thickness of about 100 $\mu$m or below by sputtering or evaporation.

However, the photovoltaic element 10 has the transparent conductive film 2, on which the above semiconductor layers are formed, and therefore, has a lower open circuit voltage (Voc) than that of a photovoltaic element having a metallic electrode on which the above semiconductor layers are formed.

SUMMARY OF THE INVENTION

It is an object of the present invention to repress the degradation of the open circuit voltage (Voc) in the photovoltaic element including the substrate, the transparent conductive film, the first conduction-type semiconductor layer, the intrinsic semiconductor layer and the second conduction-type, different from the above first conduction-type, semiconductor layer.

For achieving the above object, this invention relates to a photo-voltaic element including a substrate, a transparent conductive film provided on the substrate, an intermediate layer, provided so as to cover the transparent conductive film, made in a hydrogen gas atmosphere of 15 volume % or below hydrogen concentration, a first conduction-type semiconductor layer provided on the intermediate layer, an intrinsic semiconductor layer provided on the first conduction-type semiconductor and a second conduction-type, different from the first conduction-type, semiconductor layer provided on the intrinsic semi-conductor layer.

Moreover, this invention also relates to a method for manufacturing a photovoltaic element comprising the steps of forming a transparent conductive film on a substrate, forming an intermediate layer so as to cover the transparent conductive film in a hydrogen gas atmosphere of 15 volume % or below hydrogen concentration, and forming, on the intermediate layer, a first conduction-type semiconductor layer, an intrinsic layer and a second conduction-type, different from the first conduction-type, semiconductor layer in turn.

The present inventors have intensely studied the causes that the open circuit voltage (Voc) of the photovoltaic element having the semiconductor layers on the transparent conductive film is smaller than that of the photovoltaic element having the same semiconductor layers on the metallic electrode. As a result, they have considered the cause as follows.

Spear et al. found out by chance that the addition of a small amount of phosphor element or boron element to an amorphous silicon incorporating hydrogen elements changes the properties of the amorphous silicon drastically. Ever since, the silicon semiconductor is made by plasma CVD using a raw material gas such as silane gas and a hydrogen gas for realizing the various properties thereof. Moreover, more amount of hydrogen than the requisite amount for forming the amorphous silicon semiconductor is applied to a film-forming atmosphere, thereby to micronize the crystal grains of the amorphous silicon semiconductor.

Then, it is required in a semiconductor manufacturing process to supply relatively large amount of hydrogen to form much hydrogen plasma, and to resolve and deposit a raw material gas such as silane gas by the hydrogen plasma. Therefore, the hydrogen radical elements incorporated in the hydrogen plasma may reduce the transparent conductive film, and separate metallic elements such as indium elements or zinc elements. Then, the separated metallic elements may exist on the boundaries between the transparent conductive film and the p-type semiconductor layer, and degrade the open circuit voltage (Voc) through the deterioration of the boundary condition.

Therefore, the present inventors have made an attempt to make the transparent conductive film of an oxide material mainly incorporating plasma-proof zinc oxide or cover the transparent conductive film having a smaller resistance with the plasma-proof transparent conductive film. Concretely, a thin zinc oxide film, having a smaller conductivity and reduction sensitivity, is formed on the transparent conductive film made of tin oxide or ITO, and then, the semiconductor layers are formed on the thin zinc oxide film.

However, the above attempt can not repress the reduction of the transparent conductive film. Moreover, the thin zinc oxide film is formed at room temperature by a cheap sputtering apparatus because a high temperature sputtering requires an expensive apparatus. Therefore, the thin zinc oxide film tends to have an amorphous structure, so suffers from the reduction thereof with comparison to the crystalline zinc oxide.

Moreover, it is desired to use a flexible polymer film as the substrate because the polymer film can be produced on a large scale. However, since the polymer film is vulnerable to heating, the transparent conductive film is required to be formed at low temperature. Therefore, the transparent conductive film results in having an amorphous structure.

Furthermore, the present inventors made an attempt to form the semiconductor films on the transparent conductive film by inert gas plasma instead of hydrogen gas plasma for preventing the reduction of the transparent conductive film. In this case, however, the photovoltaic element has only a small open circuit voltage (Voc). Although the reason is unclear, it is considered as the number of the dangling bond of the p-type semiconductor layer on the transparent conductive film increases.

Therefore, the inventors paid attention to the layer structure of the photovoltaic element instead of the manufacturing method for the photovoltaic element.

As a result, the inventors found out that by forming an intermediate layer between the transparent conductive film and the p-type semiconductor layer under a hydrogen concentration atmosphere of 15 volume % or below so as to cover the transparent conductive film, the degradation of the open circuit voltage (Voc) can be repressed. That is, it is considered that the intermediate layer repress the reduction of the transparent conductive film.

In a preferred embodiment of the photovoltaic element of the present invention, an interfacial layer is formed between the first conduction-type semiconductor layer and the intrinsic semiconductor layer. The interfacial layer may improve the boundary condition between the first conduction-type semiconductor layer and the intrinsic semiconductor layer, so that the open circuit voltage (Voc) of the photovoltaic element can be enhanced.

In the case of manufacturing the photovoltaic element having the interfacial layer, the above manufacturing method further includes the steps of forming the interfacial layer between the first conduction-type semiconductor layer on the first conduction-type semiconductor layer and forming the intrinsic semiconductor layer on the interfacial layer.

BRIEF DESCRIPTION OF THE DRAWINGS

For a better understanding of this invention, reference is made to the attached drawings, wherein.

DETAILED DESCRIPTION OF PREFERRED EMBODIMENTS

Figure 1:
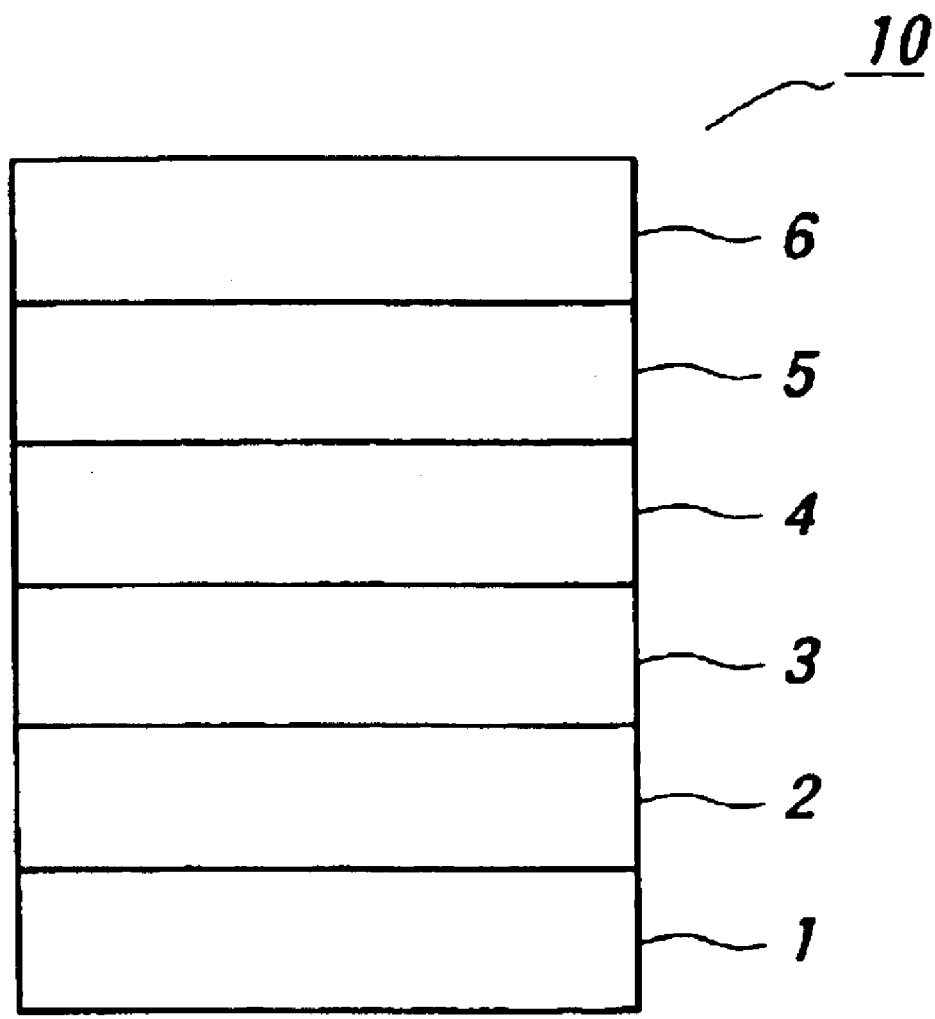
FIG. 1 is a structural view showing a conventional photovoltaic element.
Figure 2:
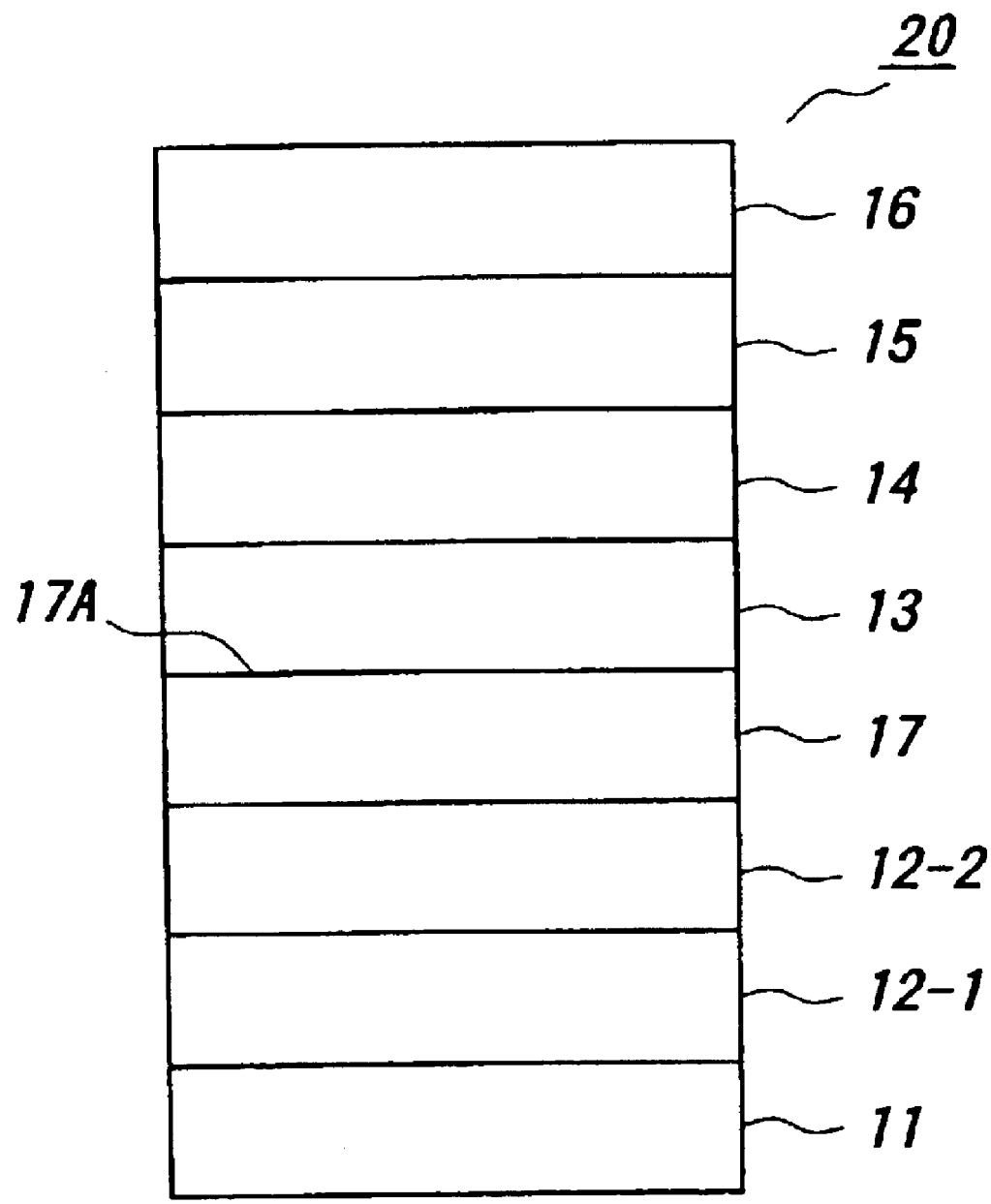
FIG. 2 is a structural view showing a photovoltaic element according to the present invention.

FIG. 2 is a structural view showing a photovoltaic element according to the present-invention.

In a photovoltaic element 20 shown in FIG. 2, a first transparent conductive film 12-1, a second transparent conductive film 12-2, a p-type semi-conductor film 13, an intrinsic semiconductor layer 14, a n-type semiconductor layer 15 and a backside electrode 16 are stacked in turn on a transparent substrate 11. Then, an intermediate layer 17 is provided between the second transparent conductive film 12-2 and the p-type semiconductor layer 13 so as to cover the first transparent conductive film 12-1 and the second transparent conductive film 12-2.

It is required that the intermediate layer 17 is formed under a hydrogen gas atmosphere of 15 volume % or below concentration, preferably 6 volume % or below concentration. Thereby, the reduction of the first transparent conductive film 12-1 and the second transparent conductive film 12-2, which are positioned under the intermediate layer 14, may be repressed, and thus, the open circuit voltage (Voc) can be enhanced. As a result, the photovoltaic element 20 can have the open circuit voltage (Voc) equal to that of a photovoltaic element having a metallic electrode on the transparent substrate in place of the above transparent conductive film.

Moreover, the intermediate layer 17 may be formed under a hydrogen atmosphere of a minute concentration, for example, at least 1 volume % concentration, preferably at least 2 volume % concentration.

It is desired that the intermediate layer 17 is formed, under the above hydrogen atmosphere, by a CVD method, particularly by a plasma CVD method for enhancing the properties of the intermediate layer 17.

Although the intermediate layer 17 may be used without any post-treatment, it is desired that a surface 17A of the intermediate layer 17 is plasma-treated under a hydrogen-reduction atmosphere. In this case, even though the intermediate layer 17 has an amorphous structure, the p-type semiconductor layer 13 to be formed on the intermediate layer 17 can be micro-crystallized. As a result, the short-circuit current (Isc) of the photovoltaic element 20 can be enhanced.

The above hydrogen reduction atmosphere includes 50–100 volume % concentration, preferably 80–100 volume % concentration, and is set to a pressure range within 1.333–1333 Pa. Then, an electric power of 30–600 mW/cm$^3$ with a high frequency wave of 13.56 MHz, for example, is applied to the hydrogen reduction atmosphere to generate a hydrogen plasma for plasma-treating the surface 17A of the intermediate layer 17.

The intermediate layer 17 may be made of any kind of material, but preferably made of the same semiconductor material as that of any one of the above semiconductor layers 13, 14 and 15. If the above semiconductor layers 13, 14 and 15 are made of a cheap silicon material, the intermediate layer 17 is also made of the silicon material. In this case, the manufacturing process of the photovoltaic element 20 can be simplified as mentioned below.

In the case of making the intermediate layer 17 of the silicon material, the intermediate layer 17 is preferably set to be a thickness of 0.5–15 nm, particularly to a thickness of 1–8 nm. If the thickness of the intermediate layer 17 is smaller than 0.5 nm, the photovoltaic element 20 may not exhibit the above-mentioned advantageous effect of the present invention. If the thickness of the intermediate layer 17 is larger than 15 nm, the series resistance of the photovoltaic element 20 may be increased, resulting in the reduction of a current in the photovoltaic element 20.

Figure 3:
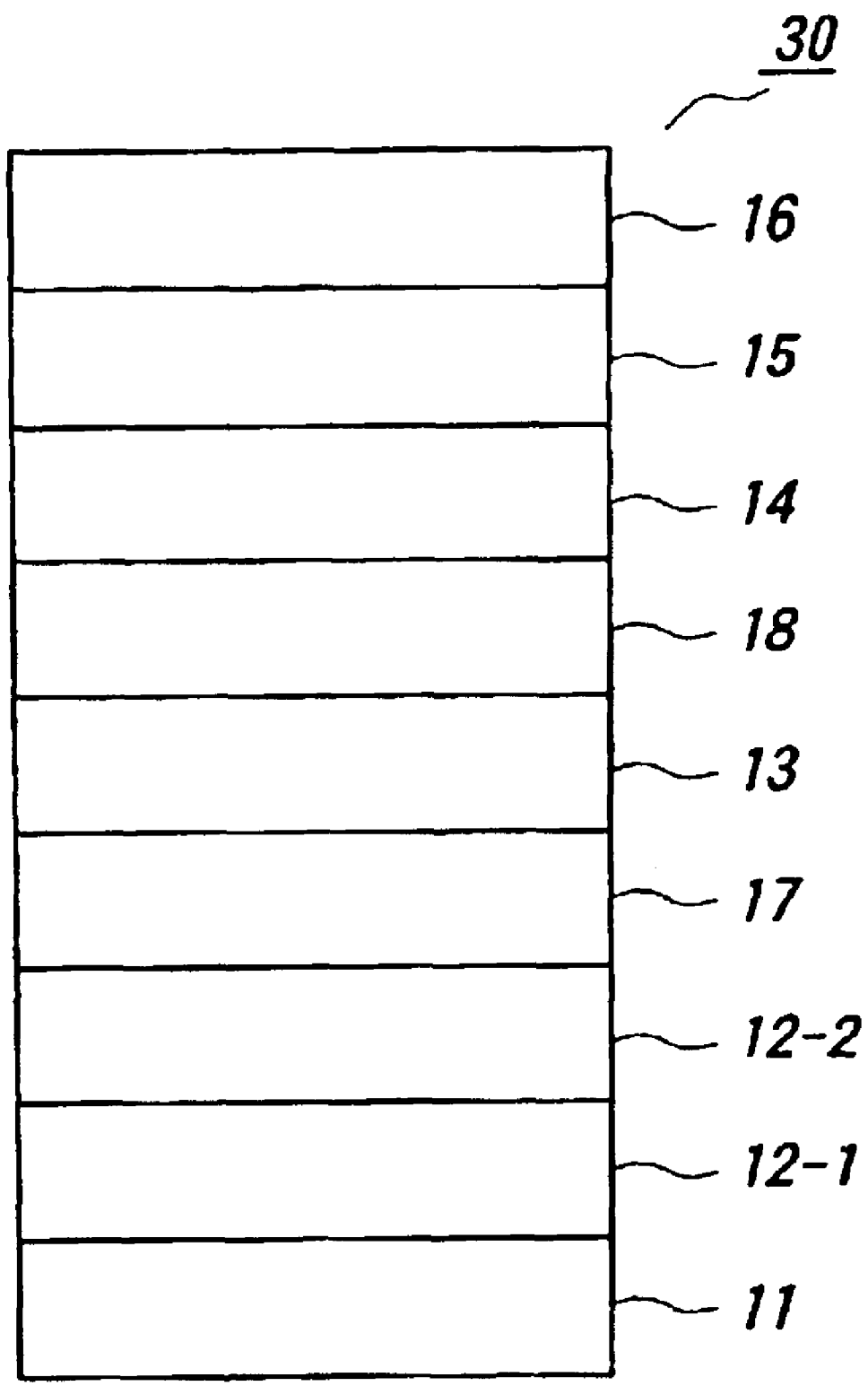
FIG. 3 is a structural view showing another photovoltaic element according to the present invention.

FIG. 3 is a structural view showing another photovoltaic element according to the present invention. In FIG. 3, the same references are given to the similar parts to the ones of the photovoltaic element 20 shown in FIG. 2.

In a photovoltaic element 30 shown in FIG. 3, a first transparent conductive film 12-1, a second transparent conductive film 12-2, a p-type semi-conductor film 13, an intrinsic semiconductor layer 14, a n-type semiconductor layer 15 and a backside electrode 16 are stacked in turn on a transparent substrate 11. Then, an intermediate layer 17 is provided between the second transparent conductive film 12-2 and the p-type semiconductor layer 13 so as to cover the first transparent conductive film 12-1 and the second transparent conductive film 12-2. Moreover, an interfacial layer 18 is provided between the p-type semiconductor layer 13 and the intrinsic semiconductor layer 14.

Since the photovoltaic element 30 has the interfacial layer 18 between the p-type semiconductor layer 13 and the intrinsic semiconductor layer 14 in addition to the intermediate layer 17 between the second transparent conductive film 12-2 and the p-type semiconductor layer 13, it can have more enhanced open circuit voltage (Voc).

The intermediate layer 17 is made by the same manner as in the photovoltaic element 20 shown in FIG. 2.

The interfacial layer 18 may be made of any kind of material, but preferably made of the same semiconductor material as that of any one of the above semiconductor layers 13, 14 and 15. If the above semiconductor layers 13, 14 and 15 are made of a silicon material, the interfacial layer 18 is also made of the silicon material. In this case, the manufacturing process of the photovoltaic element 30 can be also simplified as mentioned below.

In the case of making the interfacial layer 18 of the silicon material, the intermediate layer 18 is preferably set to be a thickness of 0.5–8 nm, particularly to a thickness of 1–4 nm. If the thickness of the interfacial layer 18 is smaller than 0.5 nm, the photovoltaic element 30 may not exhibit the above-mentioned advantageous effect of the present invention. If the thickness of the interfacial layer 18 is larger than 8 nm, the series resistance of the photovoltaic element 30 may be increased, resulting in the reduction of a current in the photovoltaic element 30.

It is desired that the p-type semiconductor layer 13, the intrinsic semiconductor layer 14 and the n-type semiconductor layer 15 are formed by a well-known film-forming technique such as a plasma CVD method under a hydrogen gas atmosphere of 70–99.8 volume % concentration for enhancing the short-circuit current through the micronization of the crystal grains of those semiconductor layers.

Although those semiconductor layers 13, 14 and 15 may be made of any kind of semiconductor material, they are preferably made of the silicon material as mentioned above because the silicon material is cheap. The p-type semiconductor layer 13 includes dopants such as boron elements in the silicon base matrix, and the n-type semiconductor layer 15 includes dopants such as phospher elements in the silicon base matrix.

Next, the manufacturing process of the above photovoltaic elements 20 and 30 will be explained below.

Generally, the p-type semiconductor layer 13, the intrinsic semi-conductor layer 14 and the n-type semiconductor layer 15 are formed, by in-line system, in different chambers for preventing the contamination of the-dopant gases for the p-type and the n-type semiconductor layers 13 and 15. The p-type semiconductor layer 13 and the n-type semiconductor layer 15 usually have a thickness of several ten nm to 50 nm, respectively, and the intrinsic semi-conductor layer usually have a thickness of 500–1000 nm. Therefore, it takes longer time in the forming process of the intrinsic semiconductor layer 14 than that of the p-type and the n-type semiconductor layers 13 and 15.

As a result, while the intrinsic semiconductor layer is formed on an assembly on an advanced manufacturing step, another assembly on a previous manufacturing step is waited for a given period until the intrinsic semiconductor layer 14 is formed after the p-type semiconductor layer 13. Therefore, it is desired that the intermediate layer 17, the p-type semiconductor layer 13 and the interfacial layer 18 are formed in the same chamber. In this case, the intermediate layer 17, the p-type semiconductor layer 13 and the interfacial layer 18 can be formed during the waiting period for the manufacturing step of the intrinsic semiconductor layer 14, and thus, the photovoltaic elements 20 and 30 can be manufactured efficiently without the prolongation of the lead time of the manufacturing process.

Even though the intermediate layer 17 and the interfacial layer 18 incorporate a small amount of dopant element, they can exhibit their respective functions sufficiently.

If the intermediate layer 17, the p-type semiconductor layer 13 and the interfacial layer 18 are made of the same material as mentioned above, they can be formed easily in the same chamber with supplying the same raw material gas continuously. Therefore, the photovoltaic elements 20 and 30 can be manufactured efficiently as mentioned above.

In the case of making the intermediate layer 17, the p-type semi-conductor layer 13 and the interfacial layer 18 of the same material, a hydrogen gas is introduced into the vacuum chamber, and the intermediate layer 17 is formed under the hydrogen gas atmosphere of a given hydrogen concentration. After the hydrogen concentration is adjusted to a predetermined concentration, the p-type semiconductor layer 13 is formed with supplying a dopant gas under the hydrogen gas atmosphere. After the supply of the dopant gas is stopped, the interfacial layer 18 is formed under the hydrogen gas atmosphere.

The transparent substrate 11 may be made of any kind of material only if the photovoltaic element 20 can exhibit the above-mentioned advantage effect of the present invention. In view of mass production, it is desired that the transparent substrate 11 is made of a polymer film having a glass-transition temperature (Tg) of 150° C. or below. PEN, PES, and PET may be exemplified as the polymer film.

The first transparent conductive film 12-1 and the second transparent conductive film 12-2 have preferably their respective amorphous structures. In this case, the above intermediate layer 17 can exhibit the reduction resistance for the transparent conductive films 12-1 and 12-2. If the transparent substrate is made of the polymer film, the transparent conductive films 12-1 and 12-2 can have the amorphous structures because they are required to be formed at low temperature of 100° C. or below due to the heat sensitivity of the polymer film.

Although the photovoltaic elements 20 and 30 shown in FIGS. 2 and 3 have two transparent conductive films composed of the first transparent conductive film 12-1 and the second transparent conductive film 12-2, it may have single transparent conductive film.

If the first transparent conductive film 12-1 is made of ITO or tin oxide which have their respective larger electric conductivity, and the second transparent conductive film 12-2 is made of zinc oxide which has larger plasma resistance, the open circuit voltage (Voc) of the photovoltaic element 20 can be more enhanced without the degradation of the properties of the photovoltaic element 20.

The backside electrode 16 may be made, of a well known metallic material such as Al, Ag or Ti, by a well known film-forming technique such as a sputtering method or a vacuum evaporation method. The backside electrode 16 may be also made by a screen printing method using a metallic paste made of the above metallic material.

In the case of making the semiconductor layers 13, 14 and 15 and the intermediate layer 17 of the silicon material, it is desired that at least one of the first transparent conductive film 12-1 and the second transparent conductive film 12-2 is electrically grounded during the formation process of the above each layer if the each layer has an oxygen impurity concentration of $8 \times 10^{18}/cm^3$ or over, a carbon impurity concentration of $4 \times 10^{18}/cm^3$ or over, or a nitrogen impurity concentration of $8 \times 10^{17}/cm^3$ or over.

In this case, even though the above each layer includes much impurities such as oxygen elements and carbon elements, the photovoltaic element can have its sufficient open circuit voltage (Voc) and the curve fill factor (FF).

It is considered as since the amount of the impurities in the above each layer is not increased, the existence condition of the impurities at the silicon network of the each layer may be changed or the number of the dangling bond of the each layer may be decreased through the change of the electric charge condition of a surface for the each layer to be formed.

It is considered that the above impurities arise from the gaseous elements and moisture elements of the polymer film to constitute the transparent substrate or the adhesive agent and the adhesive tape to fix the transparent substrate to a supporter.

EXAMPLES

This invention will be concretely described with reference to Examples.

Example 1

In this example, the photovoltaic element shown in FIG. 2 was fabricated.

An ITO film as the first transparent conductive film 12-1 was formed in a thickness of 50 nm on a PEN film as the transparent substrate 11 on the condition that the Ar gas pressure was set to be 0.4 Pa, and the oxygen gas pressure was set to be 0.08 Pa, and the introducing electric power was set to be 0.3 W/cm². The sheet resistance of the ITO film formed according to the same condition was 150 Ω/□. Then, a zinc oxide film as the second transparent conductive film 12-2 was formed in a thickness of 25 nm sequentially without the exposure to an atmosphere on condition that the Ar gas pressure was set to be 0.53 Pa, and the introducing electric power was set to be 0.79 W/cm². The sheet resistance of the zinc oxide film formed according to the same condition was 1 kΩ/□.

Then, the intermediate layer 17 was formed, in a different chamber, in a thickness of 4 nm by a PECVD method on the condition that the substrate temperature was set to be 120° C., and the flow ratio of Ar gas/SiH₄ gas was set to be 300 sccm/3 sccm, and the total pressure was set to be 56.65 Pa, and the introducing electric power was set to be 90 mW/cm².

Subsequently, the p-type semiconductor layer 13 was formed in a thickness of 6 nm by a PECVD method on the condition that the substrate temperature was set to be 120° C., and the flow ratio of B₂H₆ gas/H₂ gas/SiH₄ gas was set to be 0.02 sccm/800 sccm/4 sccm, and the total pressure was set to be 266.6 Pa, and the introducing electric power was set to be 180 mW/cm².

Then, the intrinsic semiconductor layer 14 was formed, in a different chamber, in a thickness of 600 nm by a PECVD method on the condition that the substrate temperature was set to be 160° C., and the flow ratio of H₂ gas/SiH₄ gas was set to be 500 sccm/50 sccm, and the total pressure was set to be 133.3 Pa, and the introducing electric power was set to be 50 mW/cm².

Subsequently, the n-type semiconductor layer 15 was formed, in a different chamber, in a thickness of 30 nm by a PECVD method on the condition that the substrate temperature was set to be 160° C., and the flow ratio of PH₃ gas/H₂ gas/SiH₄ gas was set to be 0.06 sccm/500 sccm/5 sccm, and the total pressure was set to be 133.3 Pa, and the introducing electric power was set to be 60 mW/cm².

Next, the backside electrode 16 was made of an Al material in a different chamber by a vacuum evaporation method to fabricate the photovoltaic element 20.

The electric property of the photovoltaic element 20 was measured by irradiating a fluorescent light having 210 lx into the photovoltaic element 20 from the transparent substrate 11, and thus measured electric property was listed in Table 1.

Example 2

Except that the intermediate layer 17 was formed in a thickness of 6 nm on the condition that the substrate temperature was set to be 160° C., and the flow ratio of Ar gas/SiH₄ gas was set to be 300 sccm/3 sccm, and the total pressure was set to be 200 Pa, and the introducing electric power was set to be 90 mW/cm², the photovoltaic element 20 was formed by the same manner as in Example 1. Then, the electric property of the photovoltaic element was measured by the same manner as in Example 1. The measured electric property was listed in Table 1.

Example 3

Except that the intermediate layer 17 was formed in a thickness of 4 nm on the condition that the substrate temperature was set to be 140° C., and the flow ratio of H₂ gas/Ar gas/SiH₄ gas was set to be 30 sccm/300 sccm/3 sccm, and the total pressure was set to be 200 Pa, and the introducing electric power was set to be 90 mW/cm², the photovoltaic element 20 was formed by the same manner as in Example 1. Then, the electric property of the photovoltaic element was measured by the same manner as in Example 1. The measured electric property was listed in Table 1.

Example 4

Except that the intermediate layer 17 was formed in a thickness of 7 nm on the condition that the substrate temperature was set to be 140° C., and the flow ratio of B₂H₆ gas/H₂ gas/Ar gas/SiH₄ gas was set to be 0.02 sccm/10 sccm/300 sccm/3 sccm, and the total pressure was set to be 66.65 Pa, and the introducing electric power was set to be 90 mW/cm², the photovoltaic element 20 was formed by the same manner as in Example 1. Then, the electric property of the photovoltaic element was measured by the same manner as in Example 1. The measured electric property was listed in Table 1.

Example 5

Except that the intermediate layer 17 was formed in a thickness of 5 nm on the condition that the substrate temperature was set to be 130° C., and the flow ratio of Ar gas/SiH₄ gas was set to be 900 sccm/3 sccm, and the total pressure was set to be 66.65 Pa, and the introducing electric power was set to be 90 mW/cm², the photovoltaic element 20 was formed by the same manner as in Example 1. Then, the electric property of the photovoltaic element was measured by the same manner as in Example 1. The measured electric property was listed in Table 1.

Example 6

Except that the intermediate layer 17 was formed in a thickness of 6 nm on the condition that the substrate temperature was set to be 130° C., and the flow ratio of Ar gas/SiH₄ gas was set to be 300 sccm/3 sccm, and the total pressure was set to be 66.65 Pa, and the introducing electric power was set to be 43 mW/cm², the photovoltaic element 20 was formed by the same manner as in Example 1. Then, the electric property of the photovoltaic element was measured by the same manner as in Example 1. The measured electric property was listed in Table 1.

Comparative Example 1

Except that the p-type semiconductor layer 13 was formed in a thickness of 10 nm without the intermediate layer, a photovoltaic element was fabricated by the same manner as in Example 1. Then, the electric property of the photovoltaic element was measured by the same manner as in Example 1. The measured electric property was listed in Table 1.

Comparative Example 2

Except that the p-type semiconductor layer 13 was formed in a thickness of 10 nm without the intermediate layer on the condition that the substrate temperature was set to be 140° C., and the flow ratio of B₂H₆ gas/H₂ gas/Ar gas/SiH₄ gas was set to be 0.02 sccm/10 sccm/300 sccm/3 sccm, and the total pressure was set to be 66.65 Pa, and the introducing electric power was set to be 90 mW/cm², a photovoltaic element was fabricated by the same manner as in Example 1. Then, the electric property of the photovoltaic element was measured by the same manner as in Example 1. The measured electric property was listed in Table 1.

Comparative Example 3

Except that the intermediate layer 17 was formed in a thickness of 6 nm on the condition that the substrate temperature was set to be 160° C., and the flow ratio of H₂ gas/Ar gas/SiH₄ gas was set to be 100 sccm/300 sccm/3 sccm, and the total pressure was set to be 200 Pa, and the introducing electric power was set to be 90 mW/cm², a photovoltaic element was fabricated by the same manner as in Example 1. Then, the electric property of the photovoltaic element was measured by the same manner as in Example 1. The measured electric property was listed in Table 1.

Example 7

In this example, the photovoltaic element shown in FIG. 3 was fabricated.

Except that the interfacial layer 18 was formed in a thickness of 5 nm by a PECVD method on the condition that the substrate temperature was set to be 120° C., and the flow ratio of H₂ gas/SiH₄ gas was set to be 500 sccm/4 sccm, and the total pressure was set to be 133.3 Pa, and the introducing electric power was set to be 50 mW/cm², the photovoltaic element was fabricated by the same manner as in Example 1. In this case, the intermediate layer 17, the p-type semiconductor layer 13 and the interfacial layer 18 were formed in the same chamber, and the manufacturing period was 24 minutes. Moreover, the manufacturing period of the intrinsic semiconductor layer 14 was 35 minutes. Then, the electric property of the photovoltaic element was measured by the same manner as in Example 1. The measured electric property was listed in Table 1.

Example 8

Except that the intermediate layer 17 and the p-type semiconductor layer 13 were formed in a thickness of 10 nm, respectively without the interfacial layer 18, a photovoltaic element was fabricated by the same manner as in Example 10. Then, the electric property of the photovoltaic element was measured by the same manner as in Example 1. The measured electric property was listed in Table 1.

Comparative Example 4

Except that the p-type semiconductor layer 13 were formed in a thickness of 10 nm, respectively without the interfacial layer 18, a photovoltaic element was fabricated by the same manner as in Example 7. Then, the electric property of the photovoltaic element was measured by the same manner as in Example 1. The measured electric property was listed in Table 1.

TABLE 1

| | Short-circuit current ($\mu$A/cm²) | Open circuit voltage (Voc) (V) | Curve fill factor (F. F) |
|---|---|---|---|
| Example 1 | 15.2 | 0.64 | 0.71 |
| Example 2 | 15.4 | 0.64 | 0.72 |
| Example 3 | 15.3 | 0.63 | 0.71 |
| Example 4 | 15.1 | 0.64 | 0.70 |
| Example 5 | 15.3 | 0.63 | 0.70 |
| Example 6 | 15.2 | 0.63 | 0.71 |
| Example 7 | — | 0.66 | — |
| Example 8 | — | 0.64 | — |
| Comparative Example 1 | 15.0 | 0.58 | 0.69 |
| Comparative Example 2 | 14.8 | 0.59 | 0.69 |
| Comparative Example 3 | 14.8 | 0.59 | 0.69 |
| Comparative Example 4 | — | 0.58 | — |

(Note) —: unmeasured

As is apparent from Examples 1–8 and Comparative Examples 1, 2 and 4, the photovoltaic elements with their respective intermediate layers can have enhanced open circuit voltages (Voc), respectively. Moreover, as is apparent from Examples 1–6 and Comparative Examples 1 and 2, the electric properties such as short-circuit current and curve fill factor (FF) of the photo-voltaic elements are enhanced as the open circuit voltages (Voc) are increased.

Moreover, as is apparent from Examples 1–8 and Comparative Example 3, when the intermediate layer is formed under the hydrogen gas atmosphere beyond the hydrogen concentration according to the present invention, the open circuit voltage (Voc) is degraded, and the short-circuit current and the curve fill factor (FF) are also degraded.

Then, as is apparent from Example 7 and Examples 1–6, 8, the photo-voltaic element having the interfacial layer can have more enhanced open circuit voltage (Voc).

Comparative Example 5

A comparative photovoltaic element was fabricated for evaluating the crystallinity of the above photovoltaic element according to the present invention.

First of all, an Al film was formed in a thickness of 500 nm on the PEN film by a DC sputtering method on the condition that the Ar gas pressure was set to be 0.5 Pa, and the sputtering electric power was set to be 6.7 W/cm². Then, a SUS 304 film was formed in a thickness of 5 nm on the condition that the Ar pressure was set to be 0.5 Pa, and the sputtering electric power was set to be 0.35 W/cm². Subsequently, the intermediate layer 17, the p-type semiconductor layer 13, the intrinsic semiconductor layer 14 and the n-type semiconductor layer 15 are formed in turn by the same manner as in Example 1.

Then, the crystallinity of the photovoltaic element fabricated in Example 4 was examined from the side of the n-type semiconductor layer side by Raman spectroscopic analysis. The result is presented FIGS. 4 and 5.

Figure 4:
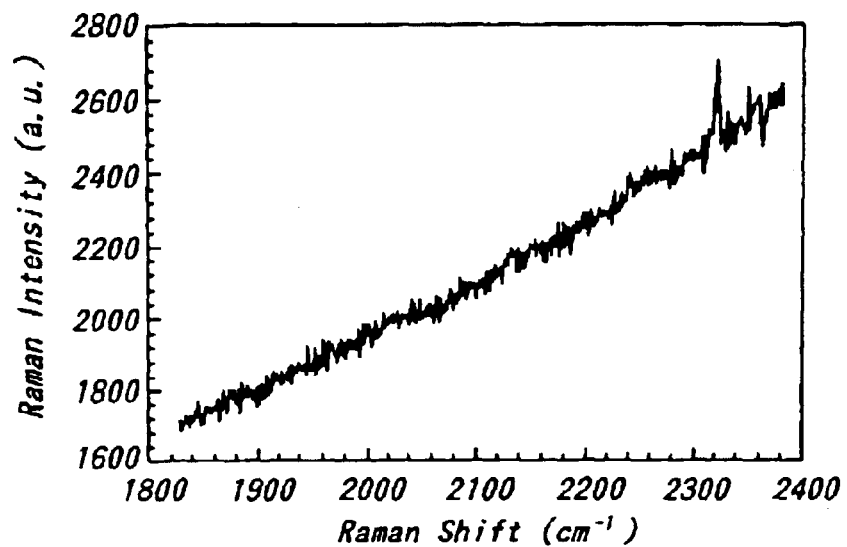
FIG. 4 is a graph showing a Raman spectroscopic analysis spectrum of a photovoltaic element according to the present invention.
Figure 5:
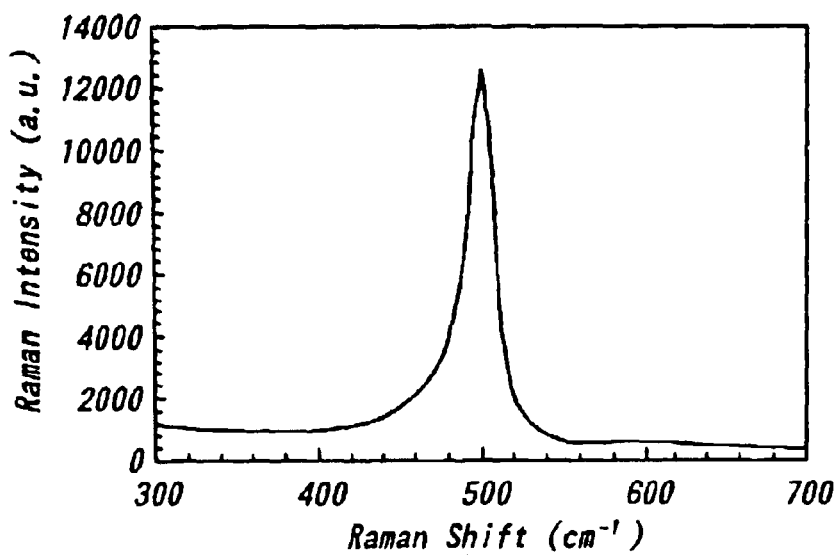
FIG. 5 is a graph showing a Raman spectroscopic analysis spectrum of a photovoltaic element according to the present invention.

As is apparent from FIGS. 4 and 5, in the n-type semiconductor layer, there are no peaks originating from the bond between hydrogen element and silicon element around 2000 $cm^{-1}$ and originating from amorphous silicon around 500 $cm^{-1}$, and there is a peak originating from crystalline silicon around 500 $cm^{-1}$.

Then, the crystallinity of the photovoltaic element fabricated in comparative Example 5 was examined from the n-type semiconductor layer by Raman spectroscopic analysis. The result is presented in FIGS. 6 and 7.

Figure 6:
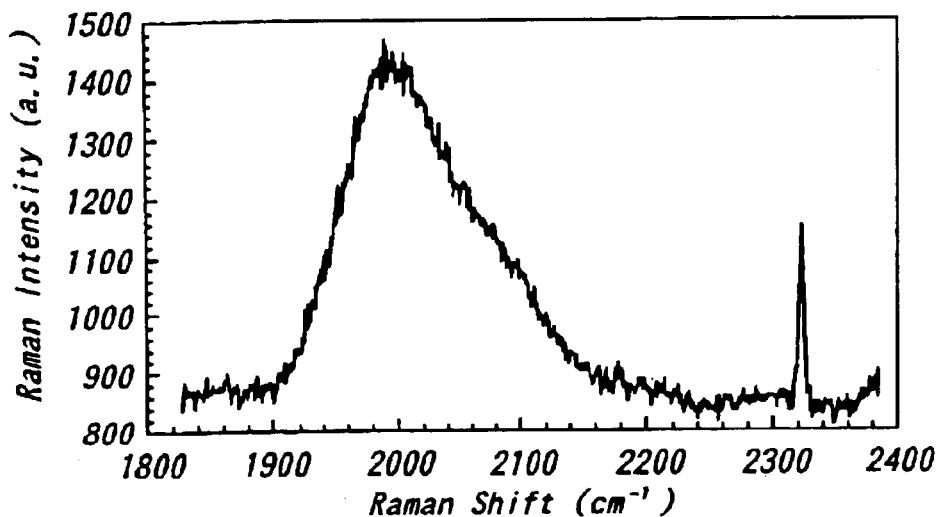
FIG. 6 is a graph showing a comparative Raman spectroscopic analysis spectrum with that of a photovoltaic element according to the present invention.
Figure 7:
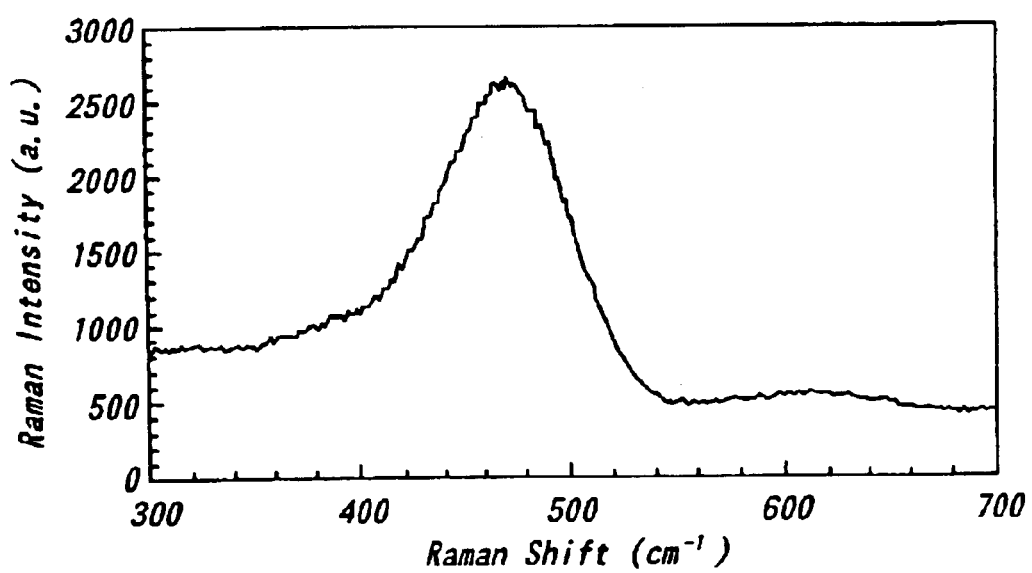
FIG. 7 is a graph showing a comparative Raman spectroscopic analysis spectrum with that of a photovoltaic element according to the present invention.

As is apparent from FIGS. 6 and 7, in the n-type semiconductor layer, there peaks originating from the bond between hydrogen element and silicon element around 2000 $cm^{-1}$ and originating from amorphous silicon around 500 $cm^-$. As a result, it is turned out from FIGS. 4–7 that the n-type semiconductor layer of the photovoltaic element according to the present invention has a good crystallinity.

Example 9

Except that before the p-type semiconductor layer 13 is formed, the photovoltaic assembly was plasma-treated for three minutes at a substrate temperature of 120° C. in a hydrogen-reduction atmosphere of 100% hydrogen concentration, the photovoltaic element 20 was fabricated by the same manner as in Example 1. In the plasma-treatment, an electric power of 60 mW/cm² with a high frequency of 13.56 MHz was introduced into the hydrogen-reduction atmosphere under the hydrogen gas flow rate of 1000 sccm and the total pressure of 66.65 Pa to generate a hydrogen plasma. Then, the electric property of the photovoltaic element was measured by the same manner as in Example 1. The measured electric property was listed in Table 2.

Example 10

Except that before the p-type semiconductor layer 13 is formed, the photovoltaic assembly was plasma-treated for six minutes at a substrate temperature of 140° C. in a hydrogen-reduction atmosphere of 100% hydrogen concentration, the photovoltaic element 20 was fabricated by the same manner as in Example 3. In the plasma-treatment, an electric power of 100 mW/cm² with a high frequency of 13.56 MHz was introduced into the hydrogen-reduction atmosphere under the hydrogen gas flow rate of 1000 sccm and the total pressure of 266.6 Pa to generate a hydrogen plasma. Then, the electric property of the photovoltaic element was measured by the same manner as in Example 1. The measured electric property was listed in Table 2.

TABLE 2

|  | Short-circuit current ($\mu A/cm^2$) | Open circuit voltage (Voc) (V) | Curve fill factor (F. F) |
|---|---|---|---|
| Example 9 | 15.6 | 0.64 | 0.72 |
| Example 10 | 15.6 | 0.63 | 0.71 |

It is turned out from Examples 1–6 and 9–10 in Tables 1 and 2 that the photovoltaic elements having their respective plasma-treated intermediate layers can have more enhanced short-circuit currents, respectively.

Example 11

Except that the first transparent conductive film 12-1 and the second transparent conductive film 12-2 are electrically grounded during the formation of the intermediate layer 17, the p-type semiconductor layer 13, the intrinsic semiconductor layer 14 and the n-type semiconductor layer 15, the photovoltaic element 20 was fabricated by the same manner as in Example 1. Then, the electric property of the photovoltaic element was measured by the same manner as in Example 1. The measured electric property was listed in Table 3.

Moreover, the impurity kind and the impurity concentration in each layer of the photovoltaic element were identified by SIMS, and are listed in Table 3. In this case, the impurity concentration is averaged throughout the each layer.

In comparison, the electric properties and the impurity concentration of each layer of the photovoltaic element fabricated in Example 1 are listed in Table 3.

TABLE 3

|  | Short-circuit current ($\mu A/cm^2$) | Open circuit Voltage (V) | Curve fill factor (F. F) | Impurity | | |
|---|---|---|---|---|---|---|
|  |  |  |  | Oxygen (atoms/$cm^3$) | Carbon (atoms/$cm^3$) | Nitrogen (atoms/$cm^3$) |
| Example 1 | 15.2 | 0.64 | 0.71 | $2 \times 10^{19}$ | $6 \times 10^{18}$ | $1 \times 10^{18}$ |
| Example 11 | 15.2 | 0.65 | 0.73 | $2 \times 10^{19}$ | $6 \times 10^{18}$ | $1 \times 10^{18}$ |

As is apparent from Table 3, although the impurity concentrations of the intermediate layer and the semiconductor layers of the photovoltaic element in Example 11 are equal to those of the photovoltaic element in Example 1, the photovoltaic element has enhanced electric properties.

This invention is not limited to the above embodiments and every kind of variation and modification may be made without departing from the scope of the present invention.

For example, in the above embodiment, the first conduction-type semiconductor layer is composed of the p-type semiconductor layer and the second conduction-type semiconductor layer is composed of the n-type semiconductor layer, but the other way around may be done.

As mentioned above, according to the present invention, even though the photovoltaic element has, on the transparent substrate, an opposed electrode made of the transparent conductive film to the backside electrode, it can have the open circuit voltage (Voc) almost equal to that of a photovoltaic element having an opposed electrode made of a metallic material.

What is claimed is:

1. A method for manufacturing a photovoltaic element comprising the steps of:

forming a transparent conductive film on a substrate, forming an intermediate layer so as to cover the transparent conductive film, the intermediate layer being formed in a hydrogen gas atmosphere in a chamber, hydrogen gas being flowed into the chamber and adjusted to have a hydrogen gas atmosphere of 15 volume % or below hydrogen concentration in the chamber, and forming, on the intermediate layer, a first conduction-type semiconductor layer, an intrinsic layer and a second conduction-type, different from the first conduction-type, semiconductor layer in turn.

2. A method for manufacturing a photovoltaic element as defined in claim 1, wherein the intermediate layer is formed in the hydrogen gas atmosphere of 6 volume % or below hydrogen concentration.

3. A method for manufacturing a photovoltaic element as defined in claim 1, wherein the intermediate layer is formed by a plasma CVD method.

4. A method for manufacturing a photovoltaic element as defined in claim 1, wherein the intermediate layer is formed of the same material as that of any one of the first conduction-type semiconductor layer, the intrinsic semiconductor layer and the second conduction-type semiconductor layer.

5. A method for manufacturing a photovoltaic element as defined in claim 4, wherein the intermediate layer is formed of the same material as that of the first conduction-type semiconductor layer.

6. A method for manufacturing a photovoltaic element as defined in claim 4, wherein the intermediate layer is made of a silicon material, and the thickness of the intermediate layer is set to be within 0.5–15 nm.

7. A method for manufacturing a photovoltaic element as defined in claim 1, wherein a surface of the intermediate layer is plasma-treated in a hydrogen-reduction atmosphere.

8. A method for manufacturing a photovoltaic element as defined in claim 1, further comprising the step of forming an interfacial layer between the first conduction-type semiconductor layer and the intrinsic semiconductor layer.

9. A method for manufacturing a photovoltaic element as defined in claim 8, wherein the interfacial layer is made of the same material as that of any one of the first conduction-type semiconductor layer, the intrinsic semiconductor layer and the second conduction-type semiconductor layer.

10. A method for manufacturing a photovoltaic element as defined in claim 9, wherein the interfacial layer is made of the same material as that of the first conduction-type semiconductor layer.

11. A method for manufacturing a photovoltaic element as defined in claim 9, wherein the interfacial layer is made of a silicon material, and the thickness of the interfacial layer is set to be within 0.5–8 nm.

12. A method for manufacturing a photovoltaic element as defined in claim 1, wherein the transparent conductive film is composed of a first transparent conductive film and a second transparent conductive film, and the first transparent conductive film is formed on the substrate, and the second transparent conductive film is formed on the first transparent conductive film.

13. A method for manufacturing a photovoltaic element as defined in claim 1, wherein the transparent conductive film is formed at a substrate temperature of 100° C. or below.

14. A method for manufacturing a photovoltaic element as defined claim 1, wherein at least one layer of the intermediate layer, the first conduction-type semiconductor layer, the intrinsic semiconductor layer and the second conduction-type semiconductor layer is formed of a silicon material, and during the formation of the at least one layer, the transparent conduction film is electrically grounded when the at least one layer includes oxygen impurities of $8\times10^{18}/cm^3$ or over concentration, carbon impurities of $4\times10^{18}/cm^3$ or over, or nitrogen impurities of $8\times10^{17}/cm^3$ or over.

* * * * *